(12) United States Patent
Im

(10) Patent No.: US 8,034,698 B2
(45) Date of Patent: Oct. 11, 2011

(54) SYSTEMS AND METHODS FOR INDUCING CRYSTALLIZATION OF THIN FILMS USING MULTIPLE OPTICAL PATHS

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 655 days.

(21) Appl. No.: 11/873,038

(22) Filed: Oct. 16, 2007

(65) Prior Publication Data
US 2008/0176414 A1 Jul. 24, 2008

Related U.S. Application Data

(62) Division of application No. 10/754,260, filed on Jan. 9, 2004, now Pat. No. 7,318,866.

(60) Provisional application No. 60/503,425, filed on Sep. 16, 2003.

(51) Int. Cl.
*H01L 21/36* (2006.01)
*H01L 21/20* (2006.01)
*B23K 26/06* (2006.01)

(52) U.S. Cl. ............... 438/487; 438/482; 219/121.61

(58) Field of Classification Search .................. None
See application file for complete search history.

(56) References Cited

U.S. PATENT DOCUMENTS

| | | | |
|---|---|---|---|
| 3,632,205 A | 1/1972 | Marcy | |
| 4,234,358 A | 11/1980 | Celler et al. | |
| 4,309,225 A | 1/1982 | Fan et al. | |
| 4,382,658 A | 5/1983 | Shields et al. | |
| 4,456,371 A | 6/1984 | Lin | |
| 4,639,277 A | 1/1987 | Hawkins | |

(Continued)

FOREIGN PATENT DOCUMENTS

DE 19839 718 9/1998

(Continued)

OTHER PUBLICATIONS

Bergmann, R. et al., Nucleation and Growth of Crystalline Silicon Films on Glass for Solar Cells, Phys. Stat. Sol., 1998, pp. 587-602, vol. 166, Germany.

(Continued)

*Primary Examiner* — Zandra Smith
*Assistant Examiner* — Pamela E Perkins
(74) *Attorney, Agent, or Firm* — Wilmer Cutler Pickering Hale and Dorr LLP

(57) ABSTRACT

The present invention is directed to systems and methods for irradiating regions of a thin film sample(s) with laser beam pulses having different energy beam characteristics that are generated and delivered via different optical paths. An exemplary method includes generating laser beam pulses having energy beam characteristics, directing a first pulse onto a first optical path, modulating the pulse's energy beam characteristics, and irradiating at least a portion of a first region of the thin film with the pulse to induce crystallization of the portion of the first region. The method includes directing a second pulse onto a second optical path, modulating the pulse's energy beam characteristics so as to be different from the energy beam characteristics of the first pulse, and irradiating at least a portion of a second region of the thin film with the second pulse to induce crystallization of the portion of the second region.

23 Claims, 8 Drawing Sheets

U.S. PATENT DOCUMENTS

| | | |
|---|---|---|
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,453,594 A | 9/1995 | Konecny |
| 5,456,763 A | 10/1995 | Kaschmitter et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,571,430 A | 11/1996 | Kawasaki et al. |
| 5,591,668 A | 1/1997 | Maegawa et al. |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka |
| 5,948,291 A | 9/1999 | Neylan et al. |
| 5,960,323 A | 9/1999 | Wakita et al. |
| 5,986,807 A | 11/1999 | Fork |
| 6,014,944 A | 1/2000 | Russell |
| 6,020,244 A | 2/2000 | Thompson et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,176,922 B1 | 1/2001 | Aklufi et al. |
| 6,177,301 B1 | 1/2001 | Jung |
| 6,184,490 B1 | 2/2001 | Schweizer |
| 6,187,088 B1 | 2/2001 | Okumura |
| 6,190,985 B1 | 2/2001 | Buynoski |
| 6,193,796 B1 | 2/2001 | Yang |
| 6,203,952 B1 | 3/2001 | O'Brien et al. |
| 6,235,614 B1 | 5/2001 | Yang |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,186 B1 | 12/2001 | Kirk et al. |
| 6,326,215 B1 | 12/2001 | Keen |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka et al. |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,784,455 B2 | 8/2004 | Maekawa et al. |
| 6,830,993 B1 | 12/2004 | Im et al. |
| 6,858,477 B2 | 2/2005 | Deane et al. |
| 6,908,835 B2 | 6/2005 | Sposili et al. |
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,132,204 B2 | 11/2006 | Jung |
| 7,144,793 B2 | 12/2006 | Gosain et al. |
| 7,164,152 B2 | 1/2007 | Im |
| 7,183,229 B2 | 2/2007 | Yamanaka |
| 7,187,016 B2 | 3/2007 | Arima et al. |
| 7,189,624 B2 | 3/2007 | Ito |
| 7,217,605 B2 | 5/2007 | Kawasaki et al. |
| 7,297,982 B2 | 11/2007 | Suzuki et al. |
| 7,311,778 B2 | 12/2007 | Im et al. |

| | | |
|---|---|---|
| 7,318,866 B2 | 1/2008 | Im |
| 7,326,876 B2 | 2/2008 | Jung |
| 7,364,952 B2 | 4/2008 | Im |
| 7,399,359 B2 | 7/2008 | Im et al. |
| 7,645,337 B2 | 1/2010 | Im et al. |
| 7,700,462 B2 | 4/2010 | Tanaka et al. |
| 2001/0001745 A1 | 5/2001 | Im et al. |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0029212 A1 | 2/2003 | Im |
| 2003/0057418 A1 | 3/2003 | Asano |
| 2003/0068836 A1 | 4/2003 | Hongo et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |
| 2005/0034653 A1 | 2/2005 | Im et al. |
| 2005/0059222 A1 | 3/2005 | You |
| 2005/0059224 A1 | 3/2005 | Im |
| 2005/0059265 A1 | 3/2005 | Im |
| 2005/0112906 A1 | 5/2005 | Maekawa et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0236908 A1 | 10/2005 | Rivin |
| 2005/0255640 A1 | 11/2005 | Im et al. |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im et al. |
| 2007/0012664 A1 | 1/2007 | Im |
| 2007/0020942 A1 | 1/2007 | Im |
| 2007/0032096 A1 | 2/2007 | Im |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0137105 A1 | 5/2009 | Im |
| 2009/0309104 A1 | 12/2009 | Im et al. |

FOREIGN PATENT DOCUMENTS

| | | |
|---|---|---|
| DE | 10103 670 | 1/2001 |
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | S57-027035 | 2/1982 |
| JP | 62160781 | 7/1987 |
| JP | 62181419 | 8/1987 |
| JP | 62216320 | 9/1987 |
| JP | H01-256114 | 10/1989 |
| JP | 2081422 | 3/1990 |
| JP | 2283036 | 11/1990 |
| JP | 04033327 | 2/1992 |
| JP | 04-279064 | 10/1992 |
| JP | 5048190 | 2/1993 |
| JP | 6252048 | 9/1994 |
| JP | 6283422 | 10/1994 |
| JP | 7176757 | 7/1995 |
| JP | H09-007968 | 1/1997 |
| JP | H10-244390 | 9/1998 |
| JP | 11064883 | 3/1999 |
| JP | 11-281997 | 10/1999 |
| JP | H11-297852 | 10/1999 |
| JP | 2000-315652 | 11/2000 |
| JP | 2000346618 | 12/2000 |
| JP | 2001-23920 | * 1/2001 |
| JP | 2001023920 | 1/2001 |
| JP | 2000223425 | 8/2002 |
| JP | 2002-353142 | 12/2002 |
| JP | 2003-031496 | 1/2003 |
| JP | 2004031809 | 1/2003 |
| JP | 20003100653 | 4/2003 |
| JP | 2004-311935 | 11/2004 |
| TW | 464960 A1 | 11/2001 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2000 |
| WO | WO 01/18854 | * 3/2001 |
| WO | WO-01/18855 | 3/2001 |
| WO | WO-01/71786 | 9/2001 |
| WO | WO-01/71791 | 9/2001 |
| WO | WO-02/31869 | 4/2002 |
| WO | WO-02/42847 | 5/2002 |
| WO | WO-02/86954 | 5/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017379 | 2/2004 |
| WO | WO-2004/017380 | 2/2004 |
| WO | WO-2004/017381 | 2/2004 |
| WO | WO-2004/017382 | 2/2004 |
| WO | WO-2004/075263 | 9/2004 |
| WO | WO-2005/029546 | 3/2005 |
| WO | WO-2005/029548 | 3/2005 |
| WO | WO-2005/029550 | 3/2005 |
| WO | WO-2005/029551 | 3/2005 |

OTHER PUBLICATIONS

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, I. W., "Laser Processing of Thin Films and Microstructures, Oxidation, Deposition and Etching of Insulators," (Springer—Verlag Berlin Heidelber, 1987.

Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).

Brotherton et al., "Influence of Melt Depth in Laser Crystallized Poly-Si Thin Film Transistors," Journal of Appl. Phys., 82:4086 (1997).

Brotherton, "Polycrystalline Silicon Thin Film Transistors," Semicond. Sci. Tech., 10:721-738 (1995).

Brotherton, S.D., et al., Characterisation of poly-Si TFTs in Directionally Solidified SLS Si, Asia Display/IDW'01, p. 387-390.

Crowder et al., "Low-Temperature Single-Crystal Si TFT's Fabricated on Si Films Processed via Sequential Lateral Solidification," IEEE Electron Device Letter, 19(8): 306 (1998).

Crowder et al., "Parametric Investigation of SLS-processed Polysilicon Thin Films for TFT Applications," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9.7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Endert et al., "Excimer Laser: A New Tool for Precision Micromachining," Optical and Quantum Electronics, 27:1319 (1995).

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven," J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Riege et al., "The Effects Microstructural Transitions at Width Transitions on interconnect reliability," Journal of Applied Physics, 87(12): 8467-8472.

Hawkins, W.G. et al., "Origin of lamellae in radiatively melted silicon flims," Appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im et al., "Controlled Super-Lateral Growth of Si Films for Microstructural Manipulation and Optimization," Phys. Stat. Sol. (a), 166:603 (1998).

Im et al., "Crystalline Si Films for Integrated Active-Matrix Liquid-Crystals Displays," MRS Bulletin, 21:39 (1996).

Im et al., "On the Super Lateral Growth Phenomenon Observed in Excimer Laser-Induced Crystallization of Thin Si Films," Appl. Phys. Lett., 64 (17): 2303 (1994).

Im et al., "Phase Transformation Mechanisms Involved in Excimer Laser Crystallization of Amorphous Silicon Films," Appl. Phys. Lett., 63 (14): 1969 (1993).

Im et al., "Single-Crystal Si Films for Thin-Film Transistor Devices," Appl. Phys. Lett., 70(25): 3434 (1997).

Ishida et al., "Ultra-shallow boxlike profiles fabricated by pulsed ultraviolet-laser doping process," J. Vac. Sci. Technol. B 12(1): 399-403, (1994).

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).

Jeon et al., "Two-step laser recrystallization of poly-Si for effective control of grain boundaries," Journal of Non Crystalline Solids, 266-269: 645-649 (2000).

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals," OE Magazine, Nov. 2001, 33-35.

Kim et al., "Grain Boundary Location-Controlled Poly-Si Films for TFT Devices Obtained Via Novel Excimer Laser Process," Mat. Res. Soc. Symp. Proc., vol. 358, 1995.

Kim et al., "Multiple Pulse Irradiation Effects in Excimer Laser-Induced Crystallization of Amorphous Si Films," Mat. Res. Soc. Sym. Proc., 321:665-670 (1994).

Kim, "Excimer-Laser-Induced Crystallization of Amorphous Silicon Thin Films," Ph. D. Dissertation Abstract, Columbia University, 1996.

Kim, C. et al., "Development of SLS-Based SOG Display," IDMC 2005, pp. 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.-J., et al., "The effects of dopants on surface-energy-driven secondary grain growth in silicon films," J. Appl. Phys. 67 (2), Jan. 15, 1990.

Kim, H.J. et al., "Multiple Pulse Irradiation Effects in Excimer Laser_Induced Crystallization of Amorphous Si Films," Materials Research Society Symposium Proceedings, vol. 321, pp. 665-670, 1994.

Kim, H.J. et al., "New Excimer-laser-crystallization method for producing large-grained and grain boundary-location-controlled Si Films for Thin Film Transistors", Applied Phys. Lett., 68: 1513.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.

Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983).

Micro/LAS Lasersystem GMBH, "Overview of Beam Delivery Systems for Excimer Lasers," (1999).

Micro/LAS Lasersystem GMBH, "UV Optics Systems for Excimer Laser Based Micromachining and Marking," (1999).

Miyasaka, M., K. Makihira, T. Asano, E. Polychroniadis and J. Stoemenos, in situ observation of nickel metal-induced lateral crystallization of amorphous silicon thin films, Appl. Phys. Lett. 80, 944 (2002).

Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).

Nebel, "Laser Interference Structuring of A-SI:h" Amorphous Silicon Technology—1996, San Francisco, CA Apr. 8-12, Materials Research Society Symposium Proceedings, vol. 420, Pittsburgh, PA (1996).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Position-Controlled Excimer-Laser-Crystallization of Silicon Thin Films on Glassy Substrate," Jpn. J. Appl. Phys. 38(10):5700-5705 (1999).

Sato et al., "Mobility anisotropy of electrons in inversion layers on oxidized silicon surfaces," Physical Review B (State) 4, 1950 (1971).

Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Sposili et al., "Sequential Lateral Solidification of Thin Silicon Films on SiO2," Appl. Phys. Lett., 69(19): 2864 (1996).

Sposili et al., "Single-Crystal Si Films via a Low-Substrate-Temperature Excimer-Laser Crystallization Method," Mat. Res. Soc. Symp. Proc., 452: 953-958 (1997).

Thompson, C.V. and H.I. Smith, Surface-energy-driven secondary grain growth in ultrathin (<100 nm) films of silicon, Appl. Phys. Lett. 44, 603 (1984).

van der Wilt, P.C. et al., "State-of-the-Art Laser Crystallization of Si for Flat Panel Displays," PhAST, May 18, 2004, pp. 1-34.

van der Wilt, P.C. et al., "The Commercialization of the SLS Technology," Taiwan FPD, Jun. 11, 2004, pp. 1-12.

van der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T. et al.: "Effect of process parameters on the structural characteristics of laterallyy grown, laser-annealed polycrystalline silicon films," Journal of applicaed Physics, vol. 94, No. 12, Dec. 15, 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

Gosain et al., "Formation of (100)—Textured Si Film Using an Excimer Laser on a Glass Substrate," Jpn. J. Appl. Phys., vol. 42 (2003) pp. L135-L137.

Im, J.S., Method and system for producing crystalline thin films with a uniform crystalline orientation, application # 60/503419; ref. file # 36013(BB); Columbia ref. M02-063.

Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No. 4B, Apr. 2000.

* cited by examiner

TRANSLATION DISTANCE - 3 μm

SYSTEMS AND METHODS FOR INDUCING CRYSTALLIZATION OF THIN FILMS USING MULTIPLE OPTICAL PATHS

CROSS-REFERENCE TO RELATED APPLICATIONS

This application is a divisional of, and claims the benefit under 35 U.S.C. §121 of U.S. patent application Ser. No. 10/754,260, filed Jan. 9, 2004 and entitled "Systems and Methods for Inducing Crystallization of Thin Films Using Multiple Optical Paths," the entire contents of which are incorporated herein by reference, which claims priority to U.S. Provisional Patent Application Ser. No. 60/503,425 filed Sep. 16, 2003.

FIELD OF THE INVENTION

This invention relates to a method and system for processing thin film material, and more particularly to forming crystalline thin films from amorphous or polycrystalline thin films using laser irradiation. In particular, the present disclosure relates to systems and methods that utilize two or more optical paths to irradiate a thin film.

BACKGROUND OF THE INVENTION

In recent years, various techniques for crystallizing or improving the crystallinity of an amorphous or polycrystalline semiconductor film have been investigated. This technology is used in the manufacture of a variety of devices, such as image sensors and active-matrix liquid-crystal display (AMLCD) devices. In the latter, a regular array of thin-film transistors (TFT) are fabricated on an appropriate transparent substrate, and each transistor serves as a pixel controller.

Semiconductor films are processed using excimer laser annealing (ELA), also known as line beam ELA, in which a region of the film is irradiated by an excimer laser to partially melt the film and then is crystallized. The process typically uses a long, narrow beam shape that is continuously advanced over the substrate surface, so that the beam can potentially irradiate the entire semiconductor thin film in a single scan across the surface. ELA produces small-grained polycrystalline films; however, the method often suffers from microstructural non-uniformities which can be caused by pulse to pulse energy density fluctuations and/or non-uniform beam intensity profiles.

Sequential lateral solidification (SLS) using an excimer laser is one method that has been used to form high quality polycrystalline films having large and uniform grains. A large-grained polycrystalline film can exhibit enhanced switching characteristics because the reduced number of grain boundaries in the direction of electron flow provides higher electron mobility. SLS processing also provides controlled grain boundary location. U.S. Pat. Nos. 6,322,625 and 6,368,945 issued to Dr. James Im, and U.S. patent application Ser. Nos. 09/390,535 and 09/390,537, the entire disclosures of which are incorporated herein by reference, and which are assigned to the common assignee of the present application, describe such SLS systems and processes.

In an SLS process, an initially amorphous (or small grain polycrystalline) silicon film is irradiated by a very narrow laser beamlet. The beamlet is formed by passing a laser beam pulse through a slotted mask, which is projected onto the surface of the silicon film. The beamlet melts the amorphous silicon and, upon cooling, the amorphous silicon film recrystallizes to form one or more crystals. The crystals grow primarily inward from edges of the irradiated area toward the center. After an initial beamlet has crystallized a portion of the amorphous silicon, a second beamlet is directed at the silicon film at a location less than the lateral growth length from the previous beamlet. Translating a small amount at a time, followed by irradiating the silicon film, promotes crystal grains to grow laterally from the crystal seeds of the polycrystalline silicon material formed in the previous step. As a result of this lateral growth, the crystals are of high quality along the direction of the advancing beamlet. The elongated crystal grains are separated by grain boundaries that run approximately parallel to the long grain axes, which are generally perpendicular to the length of the narrow beamlet. See FIG. 6 for an example of crystals grown according to this method.

When polycrystalline material is used to fabricate electronic devices, the total resistance to carrier transport is affected by the combination of barriers that a carrier has to cross as it travels under the influence of a given potential. Due to the additional number of grain boundaries that are crossed when the carrier travels in a direction perpendicular to the long grain axes of the polycrystalline material or when a carrier travels across a larger number of small grains, the carrier will experience higher resistance as compared to the carrier traveling parallel to long grain axes. Therefore, the performance of devices fabricated on polycrystalline films formed using SLS, such as TFTs, will depend upon the crystalline quality and crystalline orientation of the TFT channel relative to the long grain axes, which corresponds to the main growth direction.

Devices that utilize a polycrystalline thin film often do not require that the entire thin film have the same system performance and/or mobility orientation. For example, the pixel controller regions of a AMLCD device may require certain mobility performance and orientation, while the mobility requirements for the column and row drivers (the integration regions) may be considerably greater than for the pixel controllers region and also may be oriented differently. Processing the entire film surface, e.g., the integration regions and the pixel controller regions, under the conditions necessary to provide the high mobility requirements of the integration regions of the TFT can be inefficient and uneconomical since excess irradiation and processing time of the lower performance regions of the thin film may have been expended with no gain in system performance. To achieve acceptable system performance while optimizing manufacturing processing time and/or minimizing the energy expended in irradiating a thin film sample, laser beam pulses having different energy beam characteristics e.g., beam energy profile (density), beam shape, beam orientation, beam pulse duration, etc, can be used to process different regions of the thin film sample. This can be accomplished with systems that utilize a single optical path.

In systems having a single optical path, one or more of the optical elements and the mask (if present) can be adjusted, inserted or substituted, etc., within the optical path so as provide a laser beam pulses having different energy beam characteristics. Additionally, the orientation of the substrate, relative to the orientation of the incoming laser beam pulses, can also be adjusted to effectively produce a laser beam pulse that has different energy beam characteristics. For example, the system can include a mask that is rotatable via a mask holder. The mask is held in a first position to facilitate the irradiation processing of a first portion of the silicon film and then is rotated to a second position, e.g., rotate 90°, to facilitate the irradiation processing of a second portion of the silicon film. The system can include two masks having different masking shapes being located on a mask holder. To irradiate a first portion of the silicon film, the first mask is aligned with the laser beam optical path via the mask holder. To irradiate a second portion, the second mask is then aligned with the laser beam optical path via the mask holder, e.g., the mask holder can be a rotatable disk cartridge. Thus, laser beam pulses having different energy beam characteristics can be generated and delivered to the amorphous silicon film on the same optical path in this manner. Other prior art systems include an adjustable demagnification optical element. To generate laser beam pulses having differing energy beam characteristics, the adjustable demagnification optical element is set to a first magnification during the irradiation of a portion of the amorphous silicon film and then set to a different magnification during the irradiation of another portion of the amorphous silicon film.

Generating laser beam pulses with different energy beam characteristics along a single optical path can cause the crystallization processing times to otherwise increase since the delivery of the irradiation energy to the amorphous silicon film may need to be interrupted to facilitate the modulation of the energy beam characteristics. In this instance, a system having a single optical path may not be advantageous since the changing of the optical elements, the mask configuration or orientation, or the substrate orientation, etc., to facilitate an adjustment of the laser beam pulse's energy beam characteristics could dramatically lower the duty cycle of the delivered laser energy.

SUMMARY OF THE INVENTION

The present invention is directed to systems and methods for inducing the melting and subsequent crystallization of thin films using multiple optical paths. An optical path, as that term is used herein, refers to the trajectory of a laser beam pulse as the laser beam pulse travels from a laser beam source to a thin film sample. Optical paths thus extend through both the illumination and projection portions of the exemplary systems. Each optical path has at least one optical element that is capable of manipulating the energy beam characteristics of a laser beam pulse that is directed along that optical path. Thus, by having optical paths that include different optical elements, laser beam pulses having different energy beam characteristics can be directed via the different optical paths to different regions of the thin film sample or, alternatively, to different thin film samples. By irradiating regions of the thin film with laser beam pulses having different energy beam characteristics, acceptable system performance, e.g., mobility, of the thin film can be achieved while reducing the manufacturing processing times and/or the amount of energy that needs to be generated to facilitate the crystallization of the thin film.

The present invention can provide polycrystalline semiconductor films that are suitable for use in integrated circuit devices. The film contains a first polycrystalline or amorphous region that is processed via a laser-induced crystallization process to provide a first polycrystalline grain structure and a second polycrystalline or amorphous region that is processed in a laser-induced crystallization process to provide a second polycrystalline grain structure.

In one aspect of the invention, a method of processing a thin film includes (a) generating a plurality of laser beam pulses having energy beam characteristics; (b) directing a generated laser beam pulse onto a first optical path which includes at least one optical element; (c) modulating the energy beam characteristics of the first optical path-directed laser beam pulse via the optical element(s) of the first optical path; (d) irradiating at least a portion of a first region of the thin film with the first optical path-directed laser beam pulse to induce melting and subsequent crystallization of a portion of the first region; (e) directing a generated laser beam pulse onto a second optical path, which includes at least one optical element; (f) modulating the energy beam characteristics of the second optical path-directed laser beam pulse via the optical element(s) of the second optical path so that the energy beam characteristics of the second optical path-directed laser beam pulse is different from the energy beam characteristics of the first optical path-directed laser beam pulse; and (g) irradiating at least a portion of a second region of the thin film with the second optical path-directed laser beam pulse to induce melting and subsequent crystallization of a portion of the second region.

In one or more embodiments, the method further includes repeating steps (b)-(d) until crystallization of the first region of the thin film is promoted and repeating steps (e)-(g) until crystallization of the second region of the thin film is promoted. In certain embodiments, a first laser beam pulse irradiates a first portion of the first region and, in repeating steps (b)-(d), a second laser beam pulse irradiates a second portion of the first region at a preselected distance from the first portion of the first region. Thus, in this manner, any number of laser beam pulses may be used to facilitate the crystallization of the first region of the film. Continuing with the above process, a third laser beam pulse irradiates a first portion of the second region and, in repeating steps (e)-(g), a fourth laser beam pulse irradiates a second portion of the second region at a preselected distance from the first portion of the second region. As with the first region, any number of laser beam pulses may be used to facilitate the crystallization of the second region of the film. In some embodiments, the preselected distance from the first portion of the first region to the second portion of the first region (or the first portion of the second region to the second portion of the second region) is a distance less than the lateral crystal growth which is induced in the first portion by the first laser beam pulse.

In another aspect of the invention, a system for processing a thin film includes: a beam steering element for directing laser beam pulses onto, optionally, a first optical path or a second optical path; at least one optical element for modulating energy beam characteristics of laser beam pulses directed onto the first optical path; at least one optical element for modulating energy beam characteristics of laser beam pulses directed onto the second optical path; wherein the laser beam pulses directed onto the first optical path are directed to at least a portion of a first region of the thin film and the laser beam pulses directed onto the second optical path are directed to at least a portion of a second region of the thin film; and a handling stage for controlling the position of the thin film relative to the laser beam pulses being directed via the first and second optical paths and wherein the delivery of the first optical path-directed laser beam pulses and the second optical path-directed laser beam pulses to the thin film can induce the melting and subsequent crystallization of the thin film.

In one or more embodiments, the system further includes a laser beam source for generating the laser beam pulses which are directed to the beam steering element. In certain exemplary embodiments, the laser beam source can be a continuous wave laser, a solid state laser or an excimer laser.

In one aspect of the invention, the described methods and systems can be used to process semiconductor thin film materials. In one or more embodiments, the energy beam characteristics of the laser beam pulses are suitable for sequential laser solidification (SLS), excimer laser anneal (ELA) and uniform grain structure crystallization (UGS). In another aspect of the invention, the described methods and systems can be used to process metallic thin film materials.

BRIEF DESCRIPTION OF THE DRAWING

Various objects, features, and advantages of the present invention can be more fully appreciated with reference to the following detailed description of the invention when considered in connection with the following drawing, in which like reference numerals identify like elements. The following drawings are for the purpose of illustration only and are not intended to be limiting of the invention, the scope of which is set forth in the claims that follow.

DETAILED DESCRIPTION OF THE INVENTION

Figure 1:
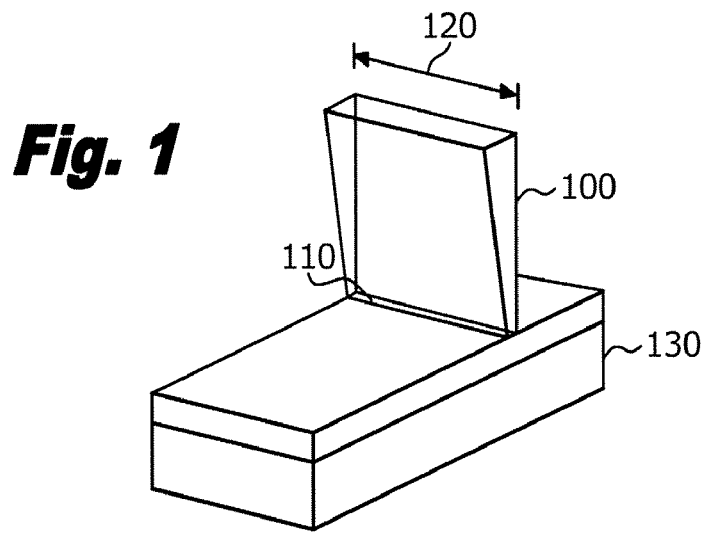
FIG. 1 illustrates the process of excimer laser annealing according to one or more embodiments of the present invention.

The quality of a thin film that has been crystallized using a laser-induced crystallization growth technique depends, in part, on the energy beam characteristics of the laser beam pulses that is used to irradiate the thin film and in the manner in which these laser beam pulses are delivered, e.g., continuous scan, two-shot, n-shot, to the film. This observation is used to crystallize different regions of the films with laser beam pulses having different energy beam characteristics in an energy- and time-efficient manner and to provide the film performance characteristics needed in device to be fabricated. Laser-induced crystallization is typically accomplished by laser irradiation using a wavelength of energy that can be absorbed by the film. The laser source may be any conventional laser source, including but not limited to, excimer laser, continuous wave laser and solid state laser. The irradiation (laser) beam pulses can also be generated by other known energy sources that are capable of generating short energy pulses that are suitable for melting thin films. Such known sources can be a pulsed solid state laser, a chopped continuous wave laser, a pulsed electron beam and a pulsed ion beam, etc.

The systems and methods of the present disclosure can be utilized to process a wide variety of types of thin films. In certain embodiments, for example, the described systems and methods can be used to process (e.g., induce and achieve desired crystallization) semiconductor thin films. Such semiconductor thin films can be comprised of silicon, germanium or silicon germanium. Other semiconductor materials, however, may also be used to make up a semiconductor thin film. In certain other embodiments, the described systems and methods may be used to process thin films that are comprised of a metallic material, such as aluminum, copper, nickel, titanium, gold and molybdenum, for example. In certain embodiments, an intermediate layer located beneath the thin film is utilized to protect the substrate from the heat and to prevent impurities from able to diffuse into the thin film. The intermediate layer can be comprised of silicon oxide, silicon nitride and/or mixtures of oxide, nitride or a wide variety of other suitable materials.

Although longer crystals demonstrate higher mobilities, the processing of the thin film is generally costly and time intensive. Devices that utilize a polycrystalline thin film, however, often do not require that the entire thin film have the same system performance and/or mobility orientation. For example, the pixel controller regions of a AMLCD device may require certain mobility performance and orientation, while the mobility requirements for the column and row drivers (the integration regions) may be considerably greater than for the pixel controllers region and also may be oriented differently. Processing the entire film surface, e.g., the integration regions and the pixel controller regions, under the conditions necessary to provide the high mobility requirements of the integration regions of the crystallized thin film can be inefficient and uneconomical since excess irradiation and processing time of the lower performance regions of the thin film may have been expended with no gain in system performance. To achieve acceptable system performance while optimizing manufacturing processing time and/or minimizing the energy expended in irradiating a thin film sample, laser beam pulses having different energy beam characteristics e.g., beam energy profile (density), beam shape, beam orientation, beam pulse duration, etc, can be delivered to different regions of the thin film via separate optical paths.

Figure 8:
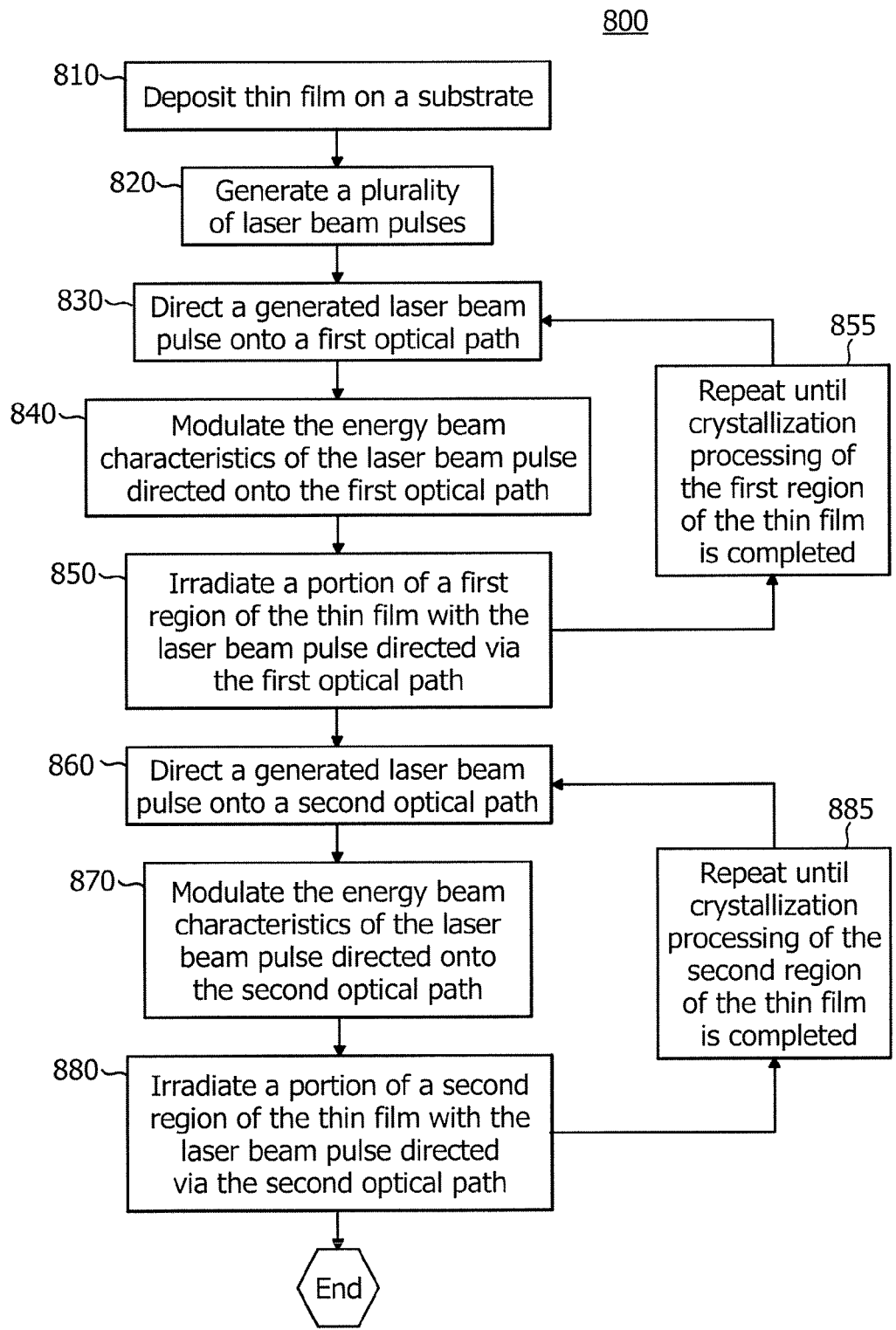
FIG. 8 is a flow chart of an exemplary embodiment of a process according to the present invention in which different regions of a thin film are irradiated by laser beam pulses having different energy beam characteristics.

According to one or more embodiments of the present invention, laser beam pulses having different energy beam characteristics irradiate, via different optical paths, different regions of a thin film. An exemplary process is set forth in the flow diagram 800 of FIG. 8.

In step 810 a thin film is deposited on a substrate. The thin film has regions that may require different system performances. In one or more embodiments, the film criteria of interest may be mobility; however other film properties such as crystal orientation, can also be considered. For example, certain regions of the thin film may be identified as pixel control regions (e.g., 'low performance'), while other regions may be identified as source/drain integration regions (e.g. 'high performance'). The fabrication of thin films is well known in the art.

In step 820 a plurality of laser beam pulses are generated by a laser source. In step 830 a laser beam pulse generated by the laser source is directed onto a first optical path. In step 840 the energy beam characteristics of the laser beam pulse directed onto the first optical path is modulated. The modulation of the energy beam characteristics typically is accomplished by at least one optical element, such as a homogenizer, attenuator or a mask, for example, that is located on the first optical path. In step 850, after modulation, at least a portion of a first region of the thin film is irradiated by the laser beam pulse that was directed along the first optical path. In step 855, the steps of directing a laser beam pulse onto the first optical path (830), modulating its energy beam characteristics (840), and irradiating a portion of the first region of the thin film with this laser beam pulse (850) are repeated until the entire first region of the thin film has been irradiated to promote the desired crystallization of the first region.

In step 860 a laser beam pulse generated by the laser source is directed onto a second optical path. In step 870 the energy beam characteristics of the laser beam pulse directed onto the second optical path is modulated. Again, the modulation of the energy beam characteristics typically is accomplished by at least one optical element that is located on the second optical path. In step 880, after modulation, at least a portion of a second region of the thin film is irradiated by the laser beam pulse that was directed along the second optical path. In step 885, the steps of directing a laser beam pulse onto the second optical path (860), modulating its energy beam characteristics (870), and irradiating a portion of the second region with this laser beam pulse (880) are repeated until the entire second region of the thin film has been sufficiently irradiated to promote the desired crystallization of the second region. The order of irradiation is not critical to the invention nor is it imperative that the first region be completed processed, e.g., irradiated, before the processing of the second region begins.

Improvements in the properties of the formed crystals may be observed regardless of the specific crystallization process employed. The thin films can be laterally or transversely crystallized, or the thin films can crystallize using spontaneous nucleation. By "lateral crystal growth" or "lateral crystallization," as those terms are used herein, it is meant a growth technique in which a region of a film is melted to the film/surface interface and in which recrystallization occurs in a crystallization front moving laterally across the substrate surface. By "transverse crystal growth" or "transverse crystallization," as those terms are used herein, it is meant a growth technique in which a region of film is partially melted, e.g., not through its entire thickness, and in which recrystallization occurs in a crystallization front moving across the film thickness, e.g., in a direction transverse to that of the above-described lateral crystallization. In spontaneous nucleation, crystal growth is statistically distributed over the melted regions and each nucleus grows until it meets other growing crystals. Exemplary crystallization techniques include excimer laser anneal (ELA), sequential lateral solidification (SLS), and uniform grain structure (UGS) crystallization.

Referring to FIG. 1, the ELA process uses a long and narrow shaped beam 100 to irradiate the thin film. In an excimer laser anneal, a line-shaped and homogenized excimer laser beam is generated and scanned across the film surface. For example, the width 110 of the center portion of the ELA beam can be up to about 1 cm (typically about 0.4 mm) and the length 120 can be up to about 70 cm (typically about 400 mm) so that the beam can potentially irradiate the entire semiconductor thin film 130 in a single pass. The excimer laser light (e.g., 308 nm) is very efficiently absorbed in an ultra thin amorphous silicon surface layer without heating the underlying substrate. Within the laser pulse duration (approx. 20-50 ns) and intensity (350-400 mJ/cm$^2$), the amorphous-silicon layer is rapidly heated and melted; however, the energy dose is controlled so that the film is not totally melted down to the substrate. As the melt cools, recrystallization into a polycrystalline structure occurs. Line beam exposure is a multishot technique with an overlay of 90% to 99%. The properties of silicon films are dependent upon the dose stability and homogeneity of the applied laser light. Line-beam exposure typically produces films with an electron mobility of 100 to 150 cm$^2$/V-s.

Figure 2:
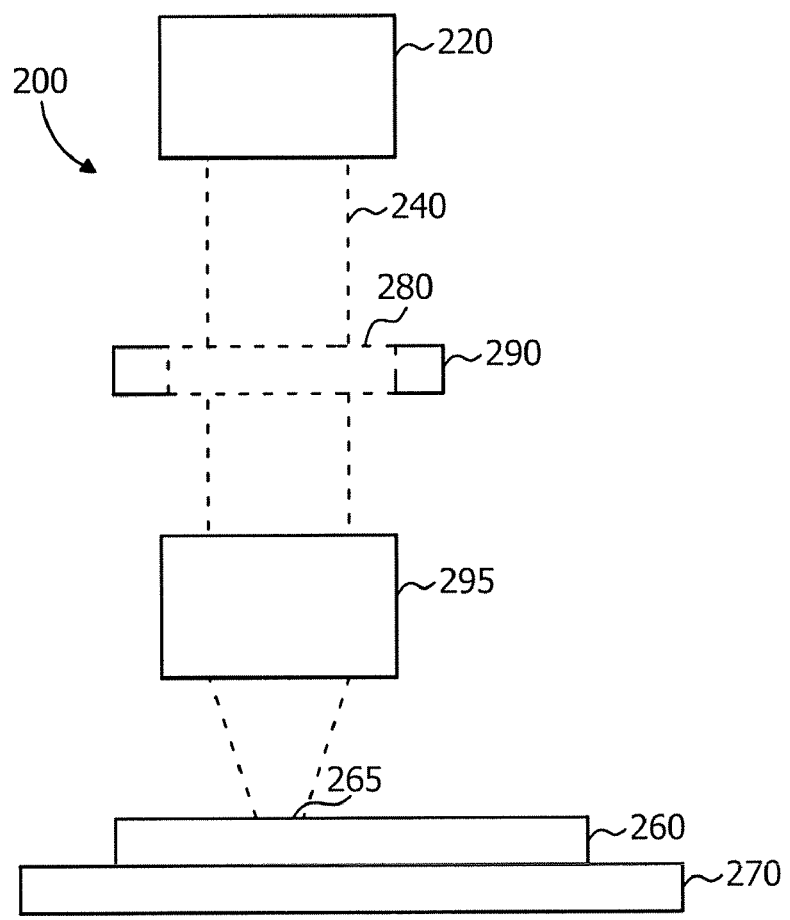
FIG. 2 shows a diagram of an exemplary system for performing a sequential lateral solidification according to one or more embodiments of the present invention.

Referring to FIG. 2, an apparatus 200 is shown that may be used for sequential lateral solidification and/or for uniform grain structure crystallization. Apparatus 200 has a laser source 220. Laser source 220 may include a laser (not shown) along with optics, including mirrors and lens, which shape a laser beam pulse 240 (shown by dotted lines) and direct it toward a substrate 260, which is supported by a stage 270. The laser beam pulse 240 passes through a mask 280 supported by a mask holder 290. The laser beam pulse 240 generated by the beam source 220 provide a beam intensity in the range of 10 mJ/cm$^2$ to 1 J/cm$^2$, a pulse duration in the range of 20 to 300 nsec, and a pulse repetition rate in the range of 10 Hz to 300 Hz. Currently available commercial lasers such as Lambda Steel 1000 available from Lambda Physik, Ft. Lauderdale, Fla., can achieve this output. After passing through the mask 280, the laser beam pulse 240 passes through projection optics 295 (shown schematically). The projection optics 295 reduces the size of the laser beam pulse, and simultaneously increases the intensity of the optical energy striking the substrate 260 at a desired location 265. The demagnification is typically on the order of between 3× and 7× reduction, preferably a 5× reduction, in image size. For a 5× reduction the image of the mask 280 striking the surface at the location 265 has 25 times less total area than the mask, correspondingly increasing the energy density of the laser beam pulse 240 at the location 265.

The stage 270 is a precision x-y stage that can accurately position the substrate 260 under the laser beam pulse 240. The stage 270 can also be capable of motion along the z-axis, enabling it to move up and down to assist in focusing or defocusing the image of the mask 280 produced by the laser beam pulse 240 at the location 265. In another embodiment of the method of the present invention, it is preferable for the stage 270 to also be able to rotate.

In uniform grain structure (UGS) crystallization, a film of uniform crystalline structure is obtained by masking a laser beam so that non-uniform edge regions of the laser beam do not irradiate the film. The mask can be relatively large, for example, it can be 1 cm×0.5 cm; however, it should be smaller than the laser beam size, so that edge irregularities in the laser beam are blocked. The laser beam provides sufficient energy to partially or completely melt the irradiated regions of the thin film. UGS crystallization provides a semiconductor film having an edge region and a central region of uniform fine grained polycrystals of different sizes. In the case where the laser irradiation energy is above the threshold for complete melting, the edge regions exhibit large, laterally grown crystals. In the case where the laser irradiation energy is below the threshold for complete melting, grain size will rapidly decrease from the edges of the irradiated region. For further detail, see U.S. application Ser. No. 60/405,084, filed Aug. 19, 2002 and entitled "Process and System for Laser Crystallization Processing of Semiconductor Film Regions on a Substrate to Minimize Edge Areas, and Structure of Such Semiconductor Film Regions," which is hereby incorporated by reference.

Sequential lateral solidification is a particularly useful lateral crystallization technique because it is capable of grain boundary location-controlled crystallization and provides crystal grain of exceptionally large size. Sequential lateral solidification produces large grained semiconductor, e.g., silicon, structures through small-scale translations between sequential pulses emitted by an excimer laser. The invention is described with specific reference to sequential lateral solidification and silicon thin films; however, it is understood that the benefits of present invention can be readily obtained using other lateral crystallization techniques or other film materials.

Figure 3:
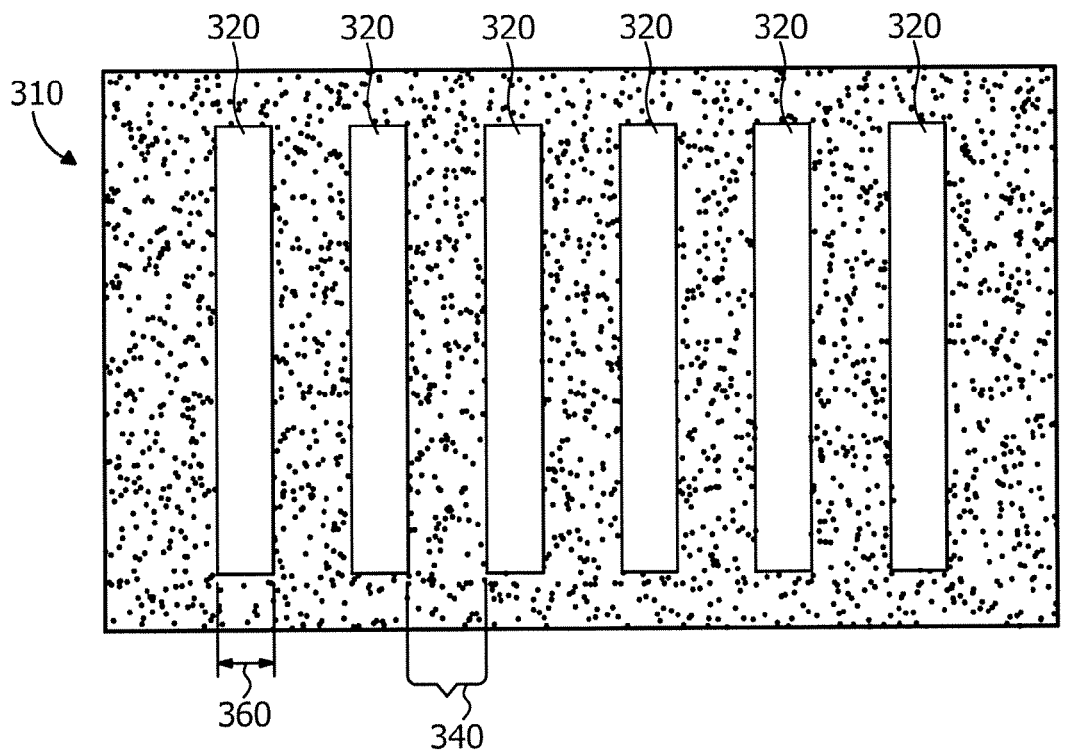
FIG. 3 shows a mask for using in a sequential lateral solidification according to one or more embodiments of the present invention

FIG. 3 shows a mask 310 having a plurality of slits 320 with slit spacing 340. The mask can be fabricated from a quartz substrate and includes a metallic or dielectric coating that is etched by conventional techniques to form a mask having features of any shape or dimension. The length of the mask features is chosen to be commensurate with the dimensions of the device that is to be fabricated on the substrate surface. The width 360 of the mask features also may vary. In some embodiments it is chosen to be small enough to avoid small grain nucleation within the melt zone, yet large enough to maximize lateral crystalline growth for each excimer pulse. By way of example only, the mask feature can have a length of between about 25 and 1000 micrometers (μm) and a width of between about two and five micrometers (μm).

An amorphous silicon thin film sample is processed into a single or polycrystalline silicon thin film by generating a plurality of excimer laser pulses of a predetermined fluence, controllably modulating the fluence of the excimer laser pulses, homogenizing the modulated laser pulses, masking portions of the homogenized modulated laser pulses into patterned beamlets, irradiating an amorphous silicon thin film sample with the patterned beamlets to effect melting of portions thereof irradiated by the beamlets, and controllably translating the sample with respect to the patterned beamlets (or vice versa) to thereby process the amorphous silicon thin film sample into a single or grain boundary-controlled polycrystalline silicon thin film.

In one or more embodiments of the sequential lateral solidification process, highly elongated crystal grains that are separated by grain boundaries that run approximately parallel to the long grain axes are produced. The method is illustrated with reference to FIG. 4 through FIG. 6.

Figure 4:
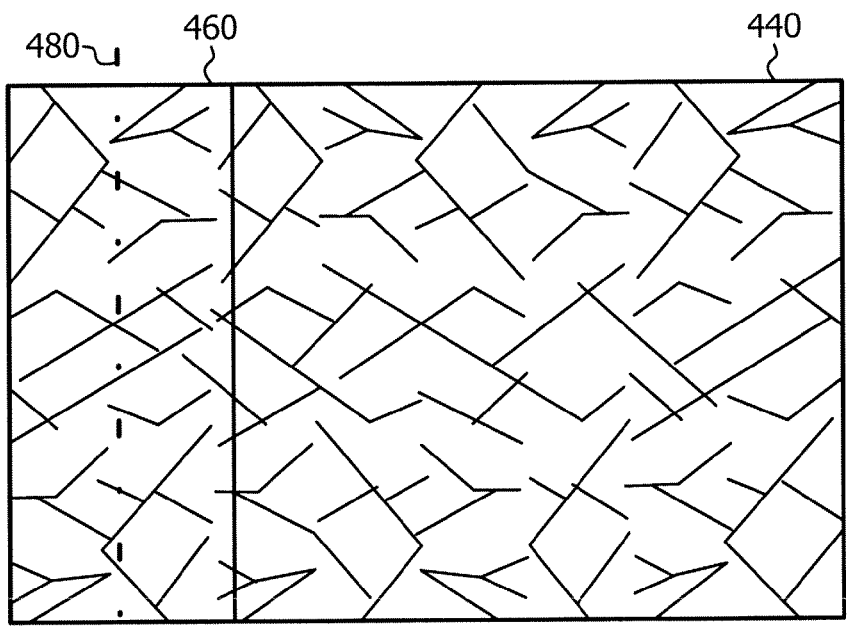
FIG. 4 illustrates a step in the process of sequential lateral solidification according to one or more embodiments of the present invention.

FIG. 4 shows the region 440 prior to crystallization. A laser pulse is directed at the rectangular area 460 causing the amorphous silicon to melt. Crystallization is initiated at solid boundaries of region 460 and continues inward towards center line 480. The distance the crystal grows, which is also referred to as the lateral growth length, is a function of the amorphous silicon film thickness, the substrate temperature, the energy beam characteristics, the buffer layer material, if any, the mask configuration, etc. A typical lateral growth length for 50 nm thick films is approximately 1.2 micrometers. After each pulse the substrate (or mask) is displaced by an amount not greater than the lateral growth length. In order to improve the quality of the resultant crystals, the sample is advanced much less than the lateral crystal growth length, e.g., not more than one-half the lateral crystal growth length. A subsequent pulse is then directed at the new area. By displacing the image of the slits 460 a small distance, the crystals produced by preceding steps act as seed crystals for subsequent crystallization of adjacent material. By repeating the process of advancing the image of the slits and firing short pulses the crystal grows epitaxially in the direction of the slits' movement.

Figure 5:
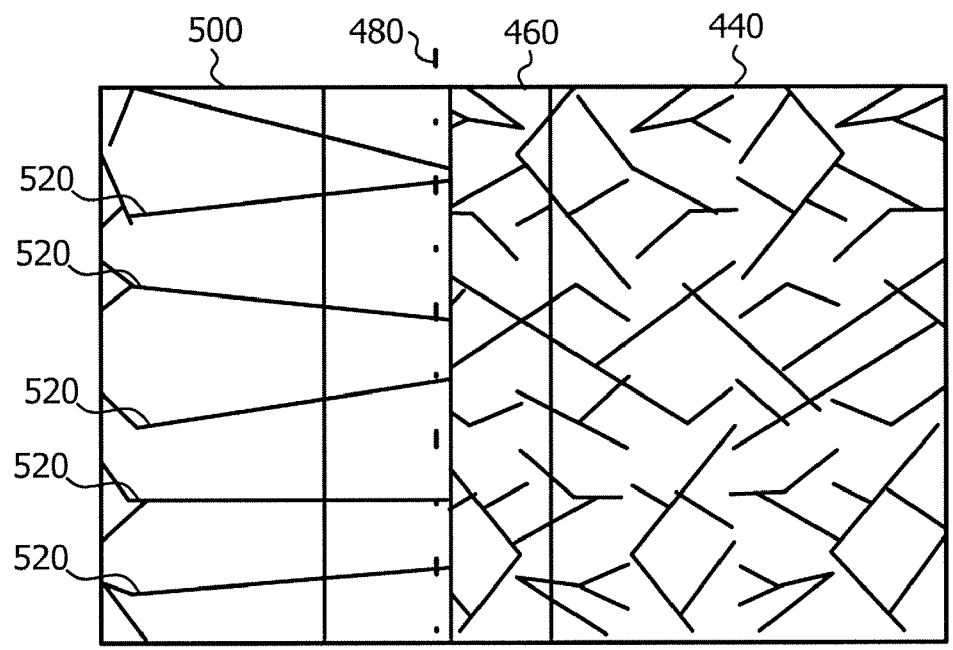
FIG. 5 illustrates a step in the process of sequential lateral solidification according to one or more embodiments of the present invention.

FIG. 5 shows the region 440 after several pulses. As is clearly shown, the area 500 that has already been treated has formed elongated crystals that have grown in a direction substantially perpendicular to the length of the slit. Substantially perpendicular means that a majority of lines formed by crystal boundaries 520 could be extended to intersect with dashed center line 480.

Figure 6:
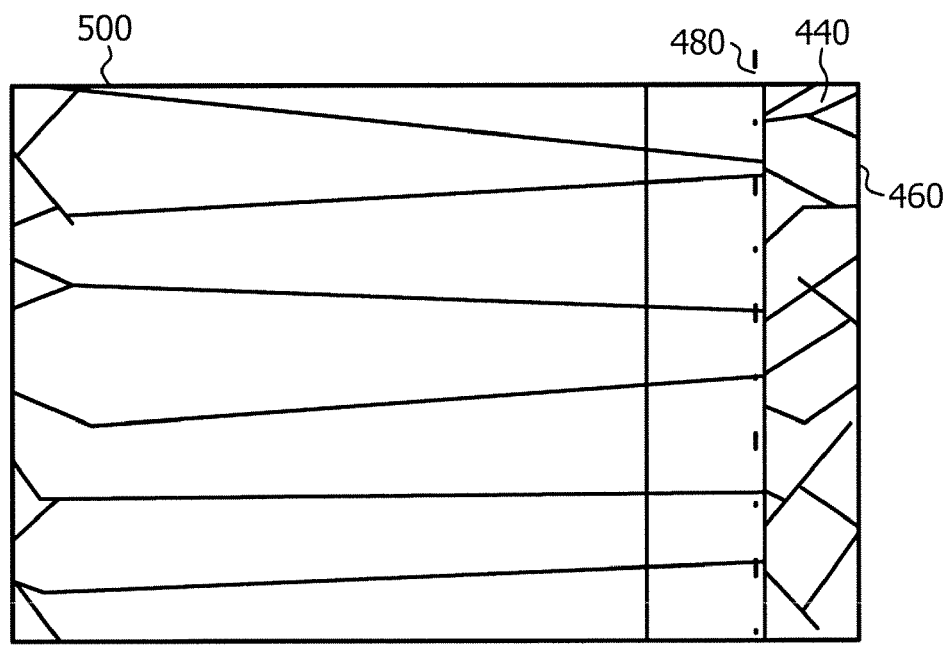
FIG. 6 illustrates a step in the process of sequential lateral solidification according to one or more embodiments of the present invention.

FIG. 6 shows the region 440 after several additional pulses following FIG. 5. The crystals have continued to grow in the direction of the slits' movement to form a polycrystalline region. The slits preferably continue to advance at substantially equal distances. Each slit advances until it reaches the edge of a polycrystalline region formed by the slit immediately preceding it.

The many microtranslations called for by the sequential lateral solidification process increase processing time; however, they produce a film having highly elongated, low defect grains. In one or more embodiments, this process is used to process the thick regions of the semiconductor film. The polycrystalline grains obtained using this process are typically of high mobility, e.g., 300-400 $cm^2$ V-s. This is the value typically found for devices with having parallel grain boundaries but few perpendicular grain boundaries. These highly elongated grains are well suited for the integrated circuitry regions on an AMLCD device.

According to the above-described method of sequential lateral solidification, the entire film is crystallized using multiple pulses. This method is hereinafter referred to as an "n-shot" process, alluding to the fact that a variable, or "n", number of laser pulses ("shots") are required for complete crystallization. Further detail of the n-shot process is found in U.S. Pat. No. 6,322,625, entitled "Crystallization Processing of Semiconductor Film Regions on a Substrate and Devices Made Therewith," and in U.S. Pat. No. 6,368,945, entitled "System for Providing a Continuous Motion Sequential Lateral Solidification," both of which are incorporated in their entireties by reference.

In one or more embodiments, regions of the semiconductor film are processed using a sequential lateral solidification process that produces shorter crystal grains than those of the preceding "n-shot" method. The film regions are therefore of lower electron mobility; however the film is processed rapidly and with a minimum number of passes over the film substrate, thereby making it a cost-efficient processing technique. These crystallized regions are well suited for the regions of the semiconductor thin film that are used for making pixel control devices of an AMLCD device.

Figure 7A:
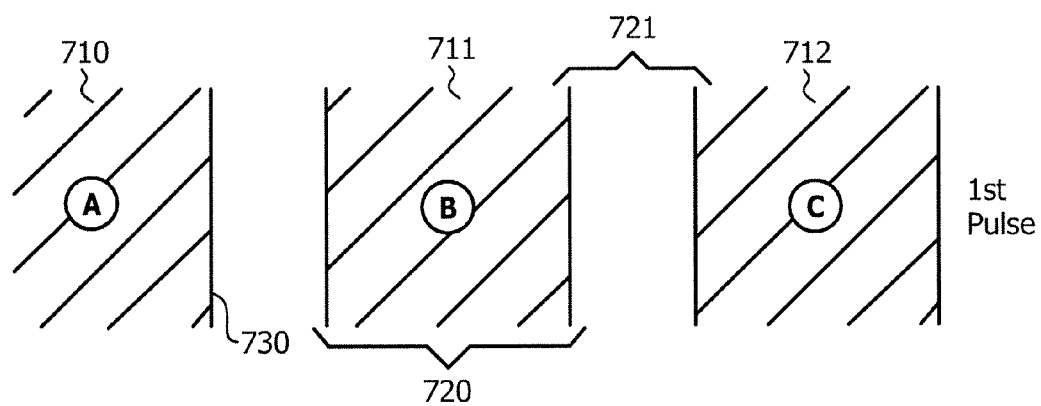
FIG. 7A through FIG. 7C illustrate a sequential lateral solidification process according to one or more embodiments of the present invention.
Figure 7B:
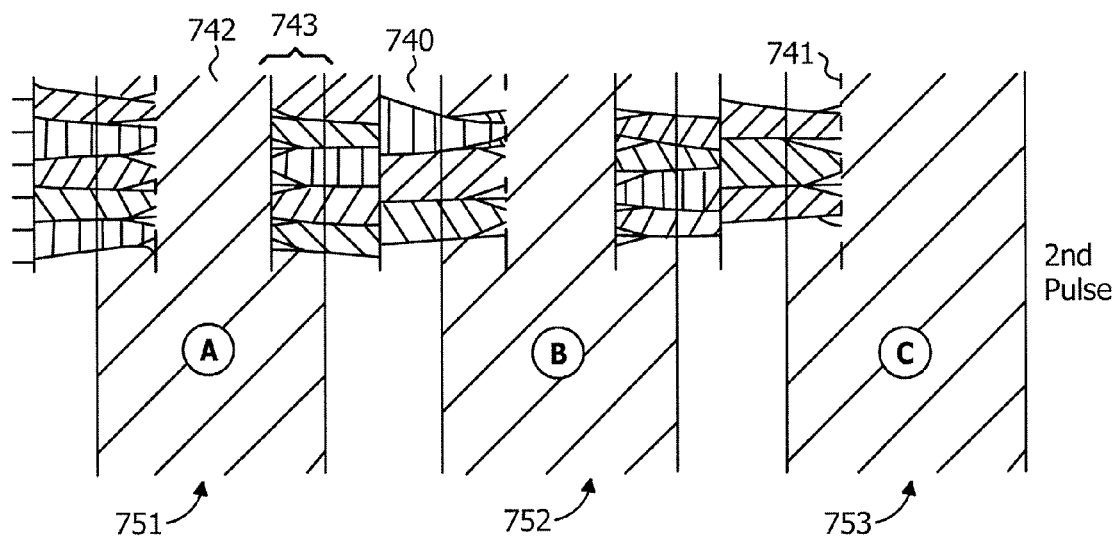

The process uses a mask such as that shown in FIG. 3, where closely packed mask lines 320 having a width 360, of about by way of example 4 μm, are each spaced apart by spacing 340 of about, by way of example, 2 μm. The sample is irradiated with a first laser pulse. As shown in FIG. 7A, the laser pulse melts regions 710, 711, 712 on the sample, where each melt region is approximately 4 μm wide 720 and is spaced approximately 2 μm apart 721. This first laser pulse induces crystal growth in the irradiated regions 710, 711, 712 starting from melt boundaries 730 and proceeding into the melt region, so that polycrystalline silicon 740 forms in the irradiated regions, as shown in FIG. 7B.

Figure 7C:
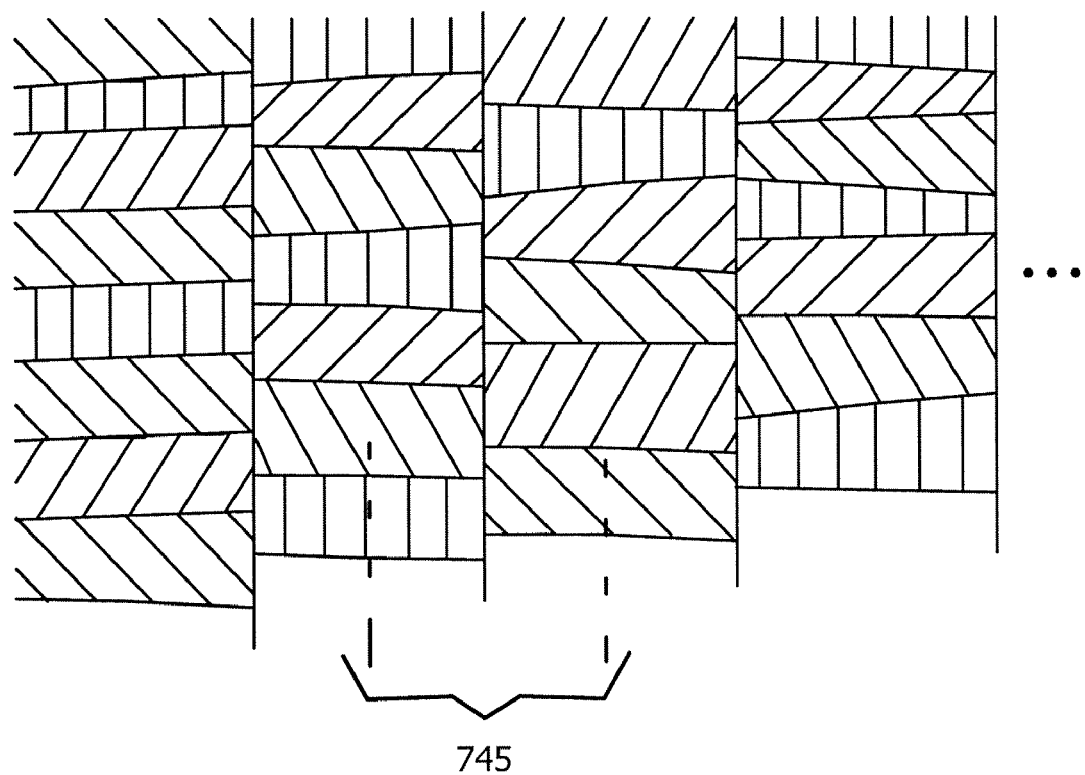

The sample is then translated approximately half the distance (or greater) of the sum of the width 360 and spacing 340, and the film is irradiated with a second excimer laser pulse. The second irradiation melts the remaining amorphous regions 742 spanning the recently crystallized region 740 and initial crystal seed region 745 to melt. As shown in FIG. 7C, the crystal structure that forms the central section 745 outwardly grows upon solidification of melted regions 742, so that a uniform long grain polycrystalline silicon region is formed.

According to the above-described method of sequential lateral solidification, the entire mask area is crystallized using only two laser pulses. This method is herein referred to as a "two-shot" process, alluding to the fact that only two laser pulses ("shots") are required for complete crystallization. Further detail of the two-shot process is found in Published International Application No. WO 01/18854, entitled "Methods for Producing Uniform Large-Grained and Grain Boundary Location Manipulated Polycrystalline Thin Film Semiconductors Using Sequential Lateral Solidification," which is incorporated in its entirety by reference.

Variations of the process are contemplated within the scope of the present invention.

According to one or more embodiments of the present invention, a first region is irradiated in a sequential lateral solidification two-shot process while a second region is irradiated in a sequential lateral solidification n-shot process. ELA and UGS crystallization can also be used to provide a polycrystalline region of uniform grain structure.

In one or more embodiments, the 'high performance' regions of the thin film that require higher mobility can be processed using a technique such as SLS that produces elongated, grain boundary location-controlled grain structure, and the 'low performance' regions of the thin film can be processed using a less expensive technique, such as UGS crystallization.

In some embodiments, different masks for the first and second irradiations are used. For example, the orientation of the mask features can vary so that crystal growth proceeds in different directions on the film.

In some embodiments, the shape and energy density of the laser beam pulses can be modified so that different regions of the thin film are irradiated with a laser beam pulse(s) (i.e., patterned beamlet) having different energy beam characteristics, e.g., beam energy profile (density), beam shape, beam pulse duration, etc. The energy beam characteristics of the laser beam pulses being delivered to the thin film can be controlled and modulated via the optical elements, e.g., lenses, homogenizers, attenuators, and demagnification optics, etc., and the configuration and orientation of a mask (s), if present. The energy beam characteristics of the delivered laser beam pulses can thus be tailored to the particular processing requirements of the portion of the thin film that is to be irradiated. By modulating the energy beam characteristics of the laser beam pulses in accordance with the processing requirements (to facilitate crystallization) of the film portion to be irradiated, the laser source's output energy can be more efficiently utilized in the crystallization fabrication process, which in turn can lead to improved (i.e., shorter) thin film processing times or lower energy processing requirements. Accordingly, the laser beam pulses can be controlled and modulated so that different regions of the film that have different processing requirements are irradiated by laser beam pulse having different energy beam characteristics. For example, the 'low performance' regions of a thin film can be subjected to laser beam pulses that have certain energy beam characteristics while the 'high performance' regions of the thin film can be subjected to laser beam pulses that have different energy beam characteristics.

Laser beam pulses having differing energy beam characteristics can be generated and delivered to the amorphous silicon film by utilizing systems that have a plurality of optical paths.

To generate laser beam pulses having differing energy beam characteristics while maintaining an acceptable delivered irradiation duty cycle, in certain exemplary embodiments, the systems for irradiating thin film sample(s) can include a plurality of optical paths. Thus, in some embodiments, the system can include two optical paths for controlling and modulating the laser beam pulses, each of which can include the necessary optical elements, e.g., beam homogenizers, demagnification optics, mirrors, lenses, etc., and (optionally) a mask to modulate the energy beam characteristics of the laser beam pulses and direct the laser beam pulses to portions of the thin film sample(s) so that crystallization can be promoted. Accordingly, the dual (or multiple) optical path system can be used to generate laser beam pulses having different energy beam characteristics, which are used to irradiate (i.e., melt) and crystallize different regions of the thin film sample(s). Thus, first laser beam pulse(s) having a first set of beam characteristics is generated and delivered via a first optical path. A selected portion of the film is irradiated with the first laser beam pulse using a first crystallization process to obtain a first crystalline region. Then, second laser beam pulse(s) is redirected onto a second optical path to generate a laser beam pulse(s) having a second set of energy beam characteristics. A selected portion of the thin film is irradiated with the second laser beam pulse(s) using a second crystallization process to obtain a second crystalline region. The crystalline regions can correspond to regions of the thin film that have different film thickness.

Figure 9:
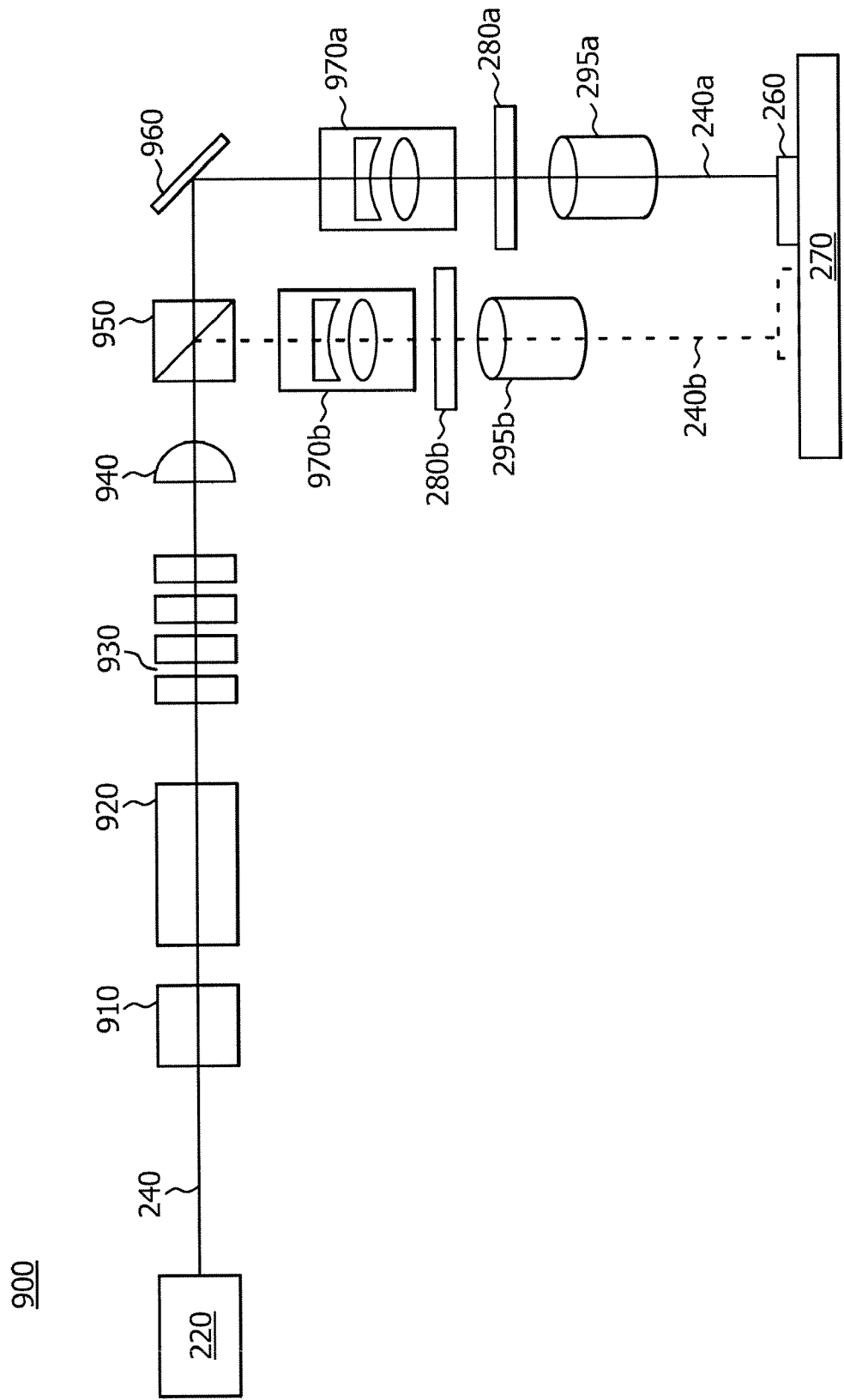
FIG. 9 is an illustration of an apparatus having two optical pathways for a single laser for use in one or more embodiments of the present invention.

An exemplary apparatus having dual optical paths that can generate and deliver laser beam pulses having different energy beam characteristics to a thin film is shown in FIG. 9. Referring to FIG. 9, the system 900 includes a laser source 220, an attenuator 910, a telescope 920, a homogenizer 930, a condenser lens 940 and a beam steering element 950. The laser beam pulses 240 generated by the laser source 220 are directed to the beam steering element 950 via the attenuator 910, telescope 920, homogenizer 930 and condenser lens 940. The attenuator 910, which may be operated in conjunction with a pulse duration extender, can be a variable attenuator, e.g., having a dynamic range of 10 to 1, capable of adjusting the energy density of the generated laser beam pulses 240. The telescope 920 can be used to efficiently adapt the beam profile of the laser beam pulses 240 to the aperture of the homogenizer 930. The homogenizer 930 can consist of two pairs of lens arrays (two lens arrays for each beam axis) that are capable of generating a laser beam pulses 240 that have a uniform energy density profile. The condenser lens 940 can condense the laser beam pulses 240 onto a downstream optical element.

At the beam steering element 950, the incoming laser beam pulses 240 are directed along one of two different out-going beam paths, each of which leads to the substrate 260 that is mounted on the wafer-handling stage 270. The first optical path includes a mirror 960, a variable-focus field lens 970a, a mask 280a and a projection lens 295a, while the second optical path includes a variable-focus field lens 970b, a mask 280b and a projection lens 295b. The masks 280a and 280b are typically mounted to mask stages (not shown) that are capable of accurately positioning the masks (e.g., in three dimensions) in relationship to the incoming laser beam pulses 240. Laser beam pulses 240 traveling along the two different optical paths will pass through optical elements that have different optical properties. For example, in one embodiment, the mask 280a of the first optical path has a different masking configuration than the mask 280b of the second optical path. Thus, laser beam pulse(s) 240a, which is directed to the substrate 260 via the first optical path, will have energy beam characteristics that are different from the energy beam characteristics of the laser beam pulse(s) 240b that is directed to the substrate 260 via the second optical path.

In certain embodiments, the beam steering element 950 can have two modes: a transmissive or pass-through mode and a reflective or redirect mode. While operating in a pass-through mode, the laser beam pulses 240 entering the beam steering element 950 essentially pass completely through the beam steering element 950 onto a first optical path. While operating in a redirect mode, the laser beam pulses 240 entering the beam steering element 950 are essentially completely redirected by a reflective surface(s) onto a second optical path.

The wafer-handling stage 270 is capable of accurately positioning the substrate 260 (e.g., in three dimensions) in relationship to the incoming laser beam pulses 240a and 240b. As previously discussed, the thin film (e.g., amorphous silicon) is deposited in a controlled manner upon a surface of the substrate 260. By utilizing two separate optical paths, system 900 is capable of delivering laser beam pulses 240a and 240b having different energy beam characteristics to different portions of the thin film, which are located on the substrate 260. For example, laser beam pulse(s) 240 can be directed to the first optical path via the beam steering element 950 so that laser beam pulse(s) 240a having first energy beam characteristics is generated and directed to certain portions of the thin film. Laser beam pulse(s) 240 can then be directed to the second optical path via the beam steering element 950 so that laser beam(s) 240b having second energy beam characteristics is generated and directed to a different portion of the thin film. Therefore, by coordinating (via a computer) the generation of the laser beam pulses 240, the operations of the beam steering element 950 and the positioning of the substrate 260 (via wafer-handling stage 270), the delivery of laser beam pulses 240a and 240b (having different energy beam characteristics) to different portions of the thin film can be facilitated.

Figure 10:
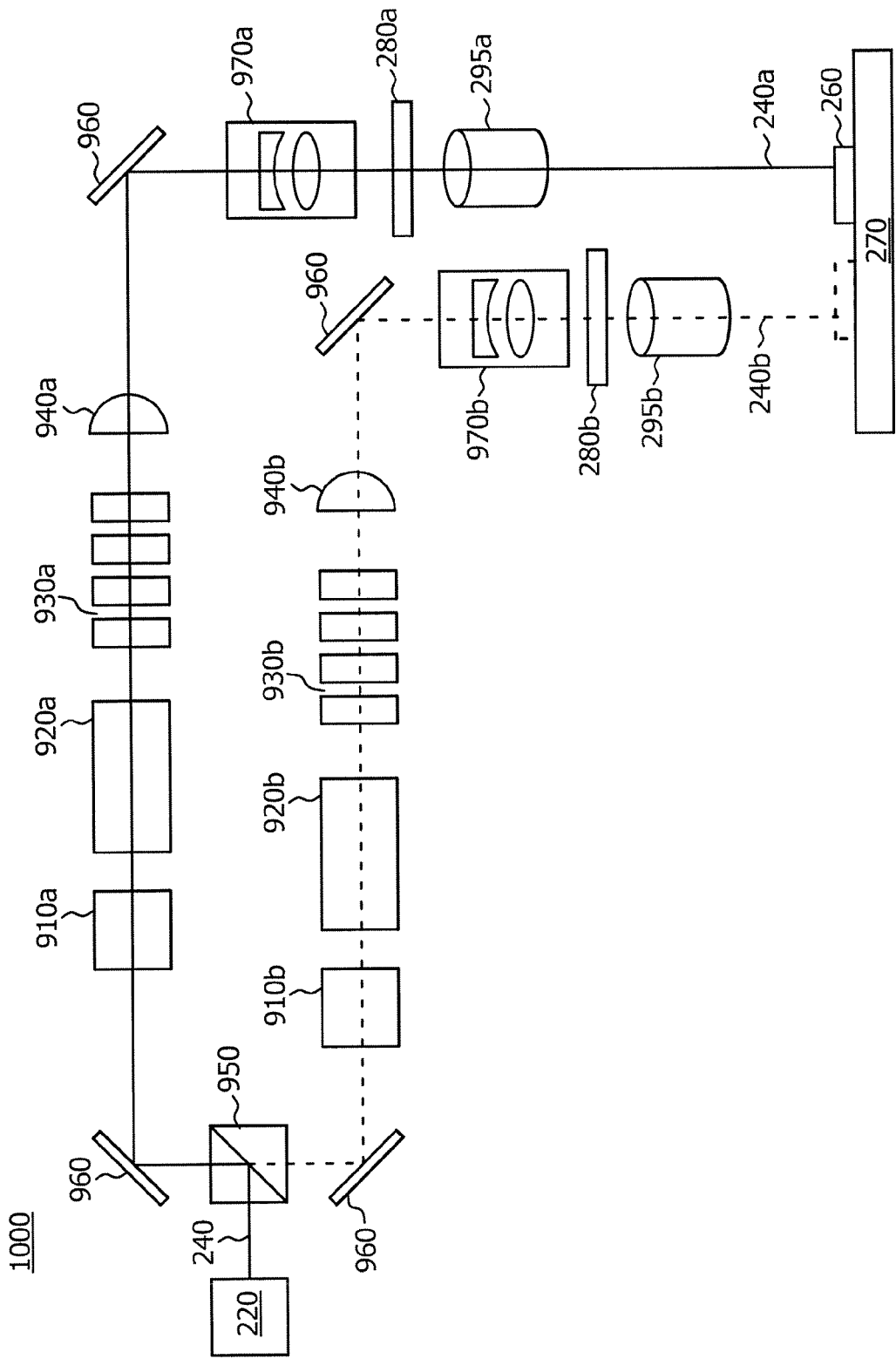
FIG. 10 is an illustration of another apparatus having two optical pathways for a single laser for use in one or more embodiments of the present invention.

Beam steering element(s) 950 can be located at a wide variety of locations within an exemplary embodiment. For example, another exemplary apparatus having dual optical paths that can generate and deliver laser beam pulses having different energy beam characteristics to a thin film is shown in FIG. 10. System 1000 of FIG. 10 is similar to the system 900 of FIG. 9, with the exception that the beam steering element 950 of system 1000 has been moved closer to the laser source 220 and away from the substrate 260 that holds the thin film sample.

Referring to FIG. 10, the system 1000 includes a laser source 220 and a beam steering element 950 that can direct laser beam pulses received from the laser source 220 onto a first optical path or a second optical path, each of which leads to the substrate 260 that is mounted on the wafer-handling stage 270. The first optical path of system 1000 includes a first mirror 960, an attenuator 910a, a telescope 920a, a homogenizer 930a, a condenser lens 940a, a second mirror 960, a variable-focus field lens 970a, a mask 280a, and a projection lens 295a. The second optical path of system 1000 includes a first mirror 960, an attenuator 910b, a telescope 920b, a homogenizer 930b, a condenser lens 940b, a second mirror 960, a variable-focus field lens 970b, a mask 280b, and a projection lens 295b. The masks 280a and 280b are typically mounted to mask stages (not shown) that are capable of accurately positioning the masks (e.g., in three dimensions) in relationship to the incoming laser beam pulses 240. Laser beam pulses 240 traveling along the two different optical paths will pass through optical elements that have different optical properties. For example, in one embodiment, the mask 280a of the first optical path has a different masking configuration than the mask 280b of the second optical path. Thus, laser beam 240a, which is directed to the substrate 260 via the first optical path, will have energy beam characteristics that are different from the energy beam characteristics of the laser beam 240b that is directed to the substrate 260 via the second optical path.

The beam steering element 950 of system 1000 has two modes: a first reflective mode for directing laser beam pulses onto the first optical path, and a second reflective mode for directing laser beam pulses onto the second optical path. Thus, the beam steering element 950 of system 1000 essentially acts as an optical switch.

The wafer-handling stage 270 is capable of accurately positioning the substrate 260 masks (e.g., in three dimensions) in relationship to the incoming laser beam pulses 240a and 240b. As previously discussed, the amorphous silicon film is deposited in a controlled manner upon a surface of the substrate 260. By utilizing two separate optical paths, system 1000 is capable of delivering laser beam pulses 240a and 240b that have different energy beam characteristics to different portions of the silicon film, which are located on the substrate 260. For example, laser beam pulse(s) 240 can be directed to the first optical path via the beam steering element 950 so that laser beam(s) 240a having first energy beam characteristics are generated and directed to certain portions of the silicon film. Laser beam(s) 240 can then be directed to the second optical path via the beam steering element 950 so that laser beam(s) 240b having second energy beam characteristics are generated and directed to different portions of the silicon film. Therefore, by coordinating (via a computer) the generation of the laser beam 240, the operations of the beam steering element 950 and the positioning of the substrate 260 via the wafer-handling stage 270, the delivery of laser beam pulses 240a and 240b (having different energy beam characteristics) to different portions of the amorphous silicon film can be facilitated.

An advantage of system 1000 over system 900 is that system 1000 provides added flexibility in being able to control the energy beam characteristics of the laser beam pulses to be delivered to the thin film, since system 1000 has more of its optical elements included in the separate optical paths. However, a disadvantage of system 1000 can be the additional cost associated with those optical elements that are provided in both optical elements, e.g., each optical path of system 1000 includes a homogenizer 930.

In certain other exemplary embodiments, a system having two or more optical paths can generate and deliver laser beam pulses having different energy beam characteristics to two or more thin film samples. For example, system 1000 can be modified so that laser beam pulse(s) 240a are delivered to a portion (or region) of a thin film that is mounted on a first substrate 260 while laser beam pulse(s) 240b are delivered to a portion (or region) of a thin film that is mounted on a second substrate 260. First and second substrates 260 may be located within the same chamber or, alternatively, first and second substrates 260 may be located in different chambers, e.g., disposed onto different handling stages 270 that are located within different chambers.

Further detail is provided in provisional patent application entitled "Laser-Irradiated Thin Films Having Variable Thickness" filed concurrently with the present disclosure, and in provisional patent application entitled "Systems And Methods For Processing Thin Films" filed concurrently with the present disclosure, the contents of which are incorporated by reference.

The semiconductor device fabricated by the present invention includes not only an element such as TFTs or MOS transistors, but also liquid crystal display devices (TFT-LCDs), EL (Electro Luminescence) display devices, EC (Electro Chromic) display devices, active-matrix organic light emitting diodes (OLEDs), static random access memory (SRAM) devices, three-dimensional integrated circuits (3-D ICs), sensors, printers, and light valves, or the like, each including a semiconductor circuit (microprocessor, signal processing circuit, high frequency circuit, etc.) constituted by insulated gate transistors.

Although various embodiments that incorporate the teachings of the present invention have been shown and described in detail herein, those skilled in the art can readily devise many other varied embodiments that incorporate these teachings.

The invention claimed is:

1. A method of processing a thin film, comprising:
   (a) generating a plurality of laser beam pulses using a laser source having energy beam characteristics;
   (b) directing a first generated laser beam pulse from the laser source onto a first optical path, wherein said first optical path includes at least one optical element;
   (c) modulating said energy beam characteristics of said first optical path-directed laser beam pulse via said at least one optical element of said first optical path;
   (d) irradiating at least a portion of a first region of said thin film with said first optical path-directed laser beam pulse to induce melting and a subsequent crystallization of said portion of said first region;
   (e) directing a second generated laser beam pulse from the same laser source onto a second optical path, wherein said second optical path includes at least one optical element;
   (f) modulating said energy beam characteristics of said second optical path-directed laser beam pulse via said at least one optical element of said second optical path, wherein said energy beam characteristics of said second optical path-directed laser beam pulse is different from said energy beam characteristics of said first optical path-directed laser beam pulse; and
   (g) irradiating at least a portion of a second region of said thin film with said second optical path-directed laser beam pulse to induce melting and a subsequent crystallization of said portion of said second region.

2. The method of claim 1, further comprising:
   repeating steps (b)-(d) until said melting and crystallization of said first region of said thin film is induced; and
   repeating steps (e)-(g) until said melting and crystallization of said second region of said thin film is induced, wherein said first region of said thin film has a first grain structure and said second region of said thin film has a second grain structure.

3. The method of claim 2, wherein at least one of the first and second grain structures comprises an elongated, grain-boundary location controlled grain structure.

4. The method of claim 2, further comprising:
   wherein the first laser beam pulse irradiates a first portion of said first region and, in
   repeating steps (b)-(d), the second laser beam pulse irradiates a second portion of said first region at a preselected distance from said first portion of said first region; and
   wherein a third laser beam pulse irradiates a first portion of said second region and, in repeating steps (e)-(g), a fourth laser beam pulse irradiates a second portion of said second region at a preselected distance from said first portion of said second region.

5. The method of claim 4, wherein said preselected distance from said first portion of said first region to said second portion of said first region is controlled by moving said thin film.

6. The method of claim 4, wherein said preselected distance from said first portion of said first region to said second portion of said first region is a distance less than the lateral crystal growth which is induced in said first portion by said first laser beam pulse.

7. The method of claim 1, wherein said laser irradiation of said first and second regions comprises a sequential lateral solidification process (SLS).

8. The method of claim 1, wherein said thin film comprises a semiconductor material.

9. The method of claim 1, wherein said first region comprises an integration region of said thin film.

10. The method of claim 9, wherein said second region comprises a pixel region of said thin film.

11. The method of claim 1, wherein said first optical path includes a first mask having a first masking pattern and said second optical path includes a second mask having a second masking pattern.

12. The method of claim 11, wherein said first masking pattern is configured to facilitate crystallization of said portion of said first region of a first preselected grain length or first grain orientation and said second masking pattern is configured to facilitate crystallization of said portion of said second region of a second preselected grain length or second grain orientation.

13. The method of claim 1, wherein said first optical path includes a first mask and a first projection lens and said second optical path includes a second mask and a second projection lens.

14. The method of claim 13, wherein said first optical path further includes a first variable-focus field lens and said second optical path further includes a second variable-focus field lens.

15. The method of claim 14, wherein said first optical path further includes a first attenuator and a first homogenizing lens element and said second optical path further includes a second attenuator and a second homogenizing lens element.

16. The method of claim 1, wherein said first and second generated laser beam pulses are generated by at least one of the following laser sources: continuous wave laser, solid state laser and excimer laser.

17. The method of claim 1, wherein irradiation conditions of said first region and said second region are selected from those suitable for at least one of the following: sequential laser solidification, excimer laser anneal and uniform grain structure crystallization.

18. The method of claim 17, wherein said irradiation conditions of said first region are suitable for sequential laser solidification and said irradiation conditions of said second regions are suitable for uniform grain structure crystallization.

19. The method of claim 1, wherein after crystallization the mobility of said at least a portion of said first region of said film is greater than the mobility of said at least a portion of said second region.

20. A method of processing a plurality of thin films, comprising:
   (a) generating a plurality of laser beam pulses having energy beam characteristics;
   (b) directing a generated laser beam pulse onto a first optical path, wherein said first optical path includes at least one optical element;
   (c) modulating said energy beam characteristics of said first optical path-directed laser beam pulse via said at least one optical element of said first optical path;
   (d) irradiating a portion of a region of a first thin film with said first optical path-directed laser beam pulse to induce melting and a subsequent crystallization of said portion of said region of said first thin film;
   (e) directing a generated laser beam pulse onto a second optical path, wherein said second optical element includes at least one optical element;

(f) modulating said energy beam characteristics of said second optical path-directed laser beam pulse via said at least one optical element of said second optical path, wherein said energy beam characteristics of said second optical path-directed laser beam pulse is different from said energy beam characteristics of said first optical path-directed laser beam pulse; and (g) irradiating a portion of a region of a second thin film with said second optical path-directed laser beam pulse to induce melting and a subsequent crystallization of said portion of said region of said second thin film.

21. The method of claim 20, further comprising:

(h) repeating steps (b)-(d) until said melting and crystallization of said region of said first thin film is induced; and (i) repeating steps (e)-(g) until said melting and crystallization of said region of said second thin film is induced, wherein said region of said first thin film has a first grain structure and said region of said second thin film has a second grain structure.

22. The method of claim 21, further comprising:

(j) directing a generated laser beam pulse onto said second optical path;

(k) modulating said energy beam characteristics of said second optical path-directed laser beam pulse via said at least one optical element of said second optical path;

(l) irradiating a portion of another region of said first thin film with said second optical path-directed laser beam pulse to induce melting and a subsequent crystallization of said portion of said another region of said first thin film;

(m) directing a generated laser beam pulse onto said first optical path;

(n) modulating said energy beam characteristics of said first optical path-directed laser beam pulse via said at least one optical element of said first optical path, wherein said energy beam characteristics of said first optical path-directed laser beam pulse is different from said energy beam characteristics of said second optical path-directed laser beam pulse; and (o) irradiating a portion of another region of said second thin film with said first optical path-directed laser beam pulse to induce melting and a subsequent crystallization of said portion of said another region of said second thin film.

23. The method of claim 22, further comprising:

(p) repeating steps (j)-(l) until said melting and crystallization of said another region of said first thin film is induced; and (q) repeating steps (m)-(n) until said melting and crystallization of said another region of said second thin film is induced.

* * * * *